US006847249B1

(12) United States Patent
Brokaw

(10) Patent No.: US 6,847,249 B1
(45) Date of Patent: Jan. 25, 2005

(54) HIGHEST AVAILABLE VOLTAGE SELECTOR CIRCUIT

(75) Inventor: A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/683,213

(22) Filed: Oct. 9, 2003

(51) Int. Cl.[7] .............................................. H03K 17/62
(52) U.S. Cl. ...................... 327/408; 327/407; 327/534
(58) Field of Search .......................... 327/63, 65, 407, 327/408, 534

(56) References Cited

U.S. PATENT DOCUMENTS

| 4,627,707 | A | * | 12/1986 | Tani et al. ................... 399/184 |
| 5,070,255 | A | * | 12/1991 | Shin .............................. 327/408 |
| 5,175,291 | A | * | 12/1992 | Kufner-Muhl .............. 544/267 |
| 6,242,971 | B1 | * | 6/2001 | Manstretta et al. ......... 327/537 |
| 6,359,497 | B1 | * | 3/2002 | Criscione .................... 327/408 |
| 6,476,664 | B2 | * | 11/2002 | Rolandi et al. ............. 327/534 |

* cited by examiner

Primary Examiner—Tuan T. Lam
Assistant Examiner—Hiep Nguyen
(74) Attorney, Agent, or Firm—Koppel, Jacobs, Patrick & Heybl

(57) ABSTRACT

A voltage selector circuit determines the highest of at least two available input voltages, and connects the highest voltage to an output terminal. The circuit includes a comparator having first and second FETs having their sources connected to first and second input voltages (V1 and V2), and which are biased with first and second bias currents. The first FET is driven on regeneratively when V1>V2, and the second FET is driven on regeneratively when V2>V1. A first switch connects V1 to an output terminal when the first FET is driven on, and a second switch connects V2 to the output terminal when the second FET is driven on. First and second diode-connected FETs are connected below the first and second FETs and carry their respective bias currents, thereby limiting the voltage swings on the FETs' gates and providing control over hysteresis.

18 Claims, 5 Drawing Sheets

HIGHEST AVAILABLE VOLTAGE SELECTOR CIRCUIT

BACKGROUND OF THE INVENTION

1. Field of the Invention

This invention relates to the field of comparators, and particularly to comparator-based circuits for selecting the most positive of several available voltages.

2. Description of the Related Art

For some electronics applications, multiple power forms are available to power the circuitry. For example, a voltage regulator's input voltage might be selected from any of several available primary and auxiliary supply voltages.

In some applications of this sort, it is useful to determine which of the available voltages is the highest. For example, in a linear voltage regulator, the control circuits which operate the pass device should be referred to a voltage at least as high as the input voltage selected for regulation. In addition, for a regulator implemented with field-effect transistors (FETs), the n-well of any FET connected to the regulated output should connect to the most positive voltage available, to avoid forward biasing its body diode(s).

One or more comparators might typically be used to determine the highest available voltage. However, a comparator as might be used for this purpose must itself be powered from one or more supply voltages. These supply voltages establish the comparator's input voltage range. However, this range might be exceeded by one or more of the voltages being compared, which could render the comparator's output unreliable.

The comparator's output voltage swing would also be defined by its supply voltages. As such, the output might not swing between the largest available voltages, and thus might be unsuitable for use by circuits intended to be responsive to the output.

SUMMARY OF THE INVENTION

A highest available voltage selector circuit is presented which overcomes the problems noted above.

The present selector circuit determines the highest of at least two available input voltages, and connects the highest voltage to an output terminal. The circuit includes at least one comparator having first and second FETs having their sources connected to first and second input voltages (V1 and V2), respectively, and which are biased with first and second bias currents, respectively. The gates of the FETs are connected such that the first FET is driven on regeneratively when V1>V2, and the second FET is driven on regeneratively when V2>V1. A first switch connects V1 to an output terminal when the first FET is driven on, and a second switch connects V2 to the output terminal when the second FET is driven on, such that the output terminal is at the highest of V1 and V2. First and second diode-connected FETs are connected below the first and second FETs, respectively, such that they conduct the first and second bias currents. These FETs serve to limit the voltage swing on the first and second FETs' gates, and to provide control over the comparator's hysteresis.

The selector circuit can be arranged such that the comparator is powered by the voltages it compares, and has an output which swings up to the largest available input voltage. The selected voltage can be connected to the wells of MOSFETs to ensure that they are connected to the most positive of the available input voltages, so as to avoid forward biasing their body diodes. The selected voltage can also be used to power circuits which should be referred to the highest available input voltage. Separate outputs can be provided for each of these purposes, to avoid problems which might be caused by momentarily forward biasing body diodes when glitches occur in the powered circuits.

Further features and advantages of the invention will be apparent to those skilled in the art from the following detailed description, taken together with the accompanying drawings.

DETAILED DESCRIPTION OF THE INVENTION

Figure 1:
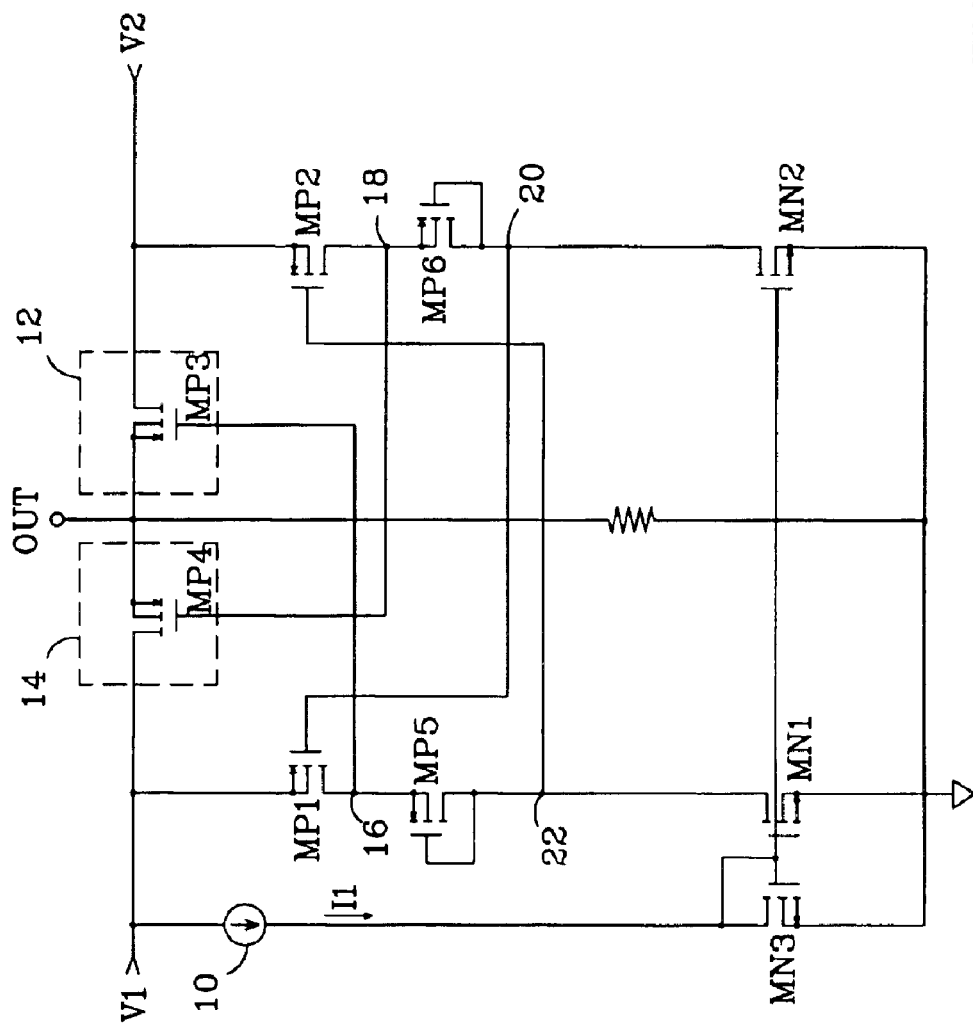
FIG. 1 is a schematic diagram of a voltage selector circuit per the present invention.

A schematic diagram of a voltage selector which connects the highest of several available input voltages to an output terminal is shown in FIG. 1. In this exemplary embodiment, two input voltages V1 and V2 are available. The determination of which of V1 and V2 is more positive is made by a comparator, the inputs of which are the sources of a first FET MP1 and a second FET MP2. Comparator FETs MP1 and MP2 are preferably biased with equal currents. The bias currents are suitably provided by a pair of FETs MN1 and MN2, respectively, each of which is connected in a current mirror configuration with a diode-connected FET MN3. MN3 is connected to conduct a current I1 provided by a current source 10, which is mirrored to MP1 and MP2 via MN1 and MN2, respectively.

MP1 and MP2 are connected in a positive feedback arrangement, such that MP1 is driven on regeneratively when V1>V2, and MP2 is driven on regeneratively when V2>V1.

The drain of MP1 (a node 16) and the drain of MP2 (a node 18) are connected to operate switches 12 and 14, respectively, which are suitably implemented with FETs MP3 and MP4, respectively. Switch 12 is connected between V2 and an output terminal OUT, and switch 14 is connected between V1 and OUT. In operation, when V1>V2, MP1 is driven on such that the voltage at node 16 increases, and MP2 is driven off such the voltage at node 18 decreases. When switches 12 and 14 are PMOS FETs, the node 16 voltage turns off switch 12, the node 18 voltage turns on switch 14, and V1—i.e., the higher of V1 and V2—is thereby connected to OUT.

Similarly, when V2>V1, MP2 is driven on such that the voltage at node 18 increases, MP1 is driven off such the voltage at node 16 decreases, switch 12 is turned on, switch 14 is turned off, and V2 is connected to OUT.

Because of the positive feedback connection and regenerative switching, the drain terminals of MP1 and MP2

(nodes 16 and 18) would normally exhibit a large voltage swing when the comparator changes states, which would be cross-coupled back to the gates of the opposing FETs thereby causing the comparator to exhibit hysteresis which may be unwanted or unacceptably large. To limit the positive swing of the gates on the opposing sides of the comparator, two diode-connected FETs MP5 and MP6 are added, with MP5 connected between node 16 and MN1 such that it conducts MP1's bias current, and MP6 connected between node 18 and MN2 such that it conducts MP2's bias current. Positive feedback is achieved by connecting the gate of MP1 to the junction 20 of MP6 and MN2, and connecting the gate of MP2 to the junction 22 of MP5 and MN1.

When so arranged, diode-connected transistors MP5 and MP6 limit the voltage swings at nodes 20 and 22—and thus at the gates of MP1 and MP2—that would otherwise occur when the comparator changes state. Assume, for example, that V2>V1 and MP2 is driven on. The presence of MP6 limits the swing of node 20 to a voltage well below V2. MP6 is preferably comparable in size to that of the other FETs in the circuit; as such, the voltage across it when connected as a diode must exceed a threshold voltage. Thus, if V1 becomes equal to V2, the gate voltage of MP1 will be at least a threshold below its source voltage. Now, if V1 increases even a small amount, the current in MP1 will increase; when this current overcomes the MN1 current, the gate of MP2 will start positive, reducing the MP2 drive and causing node 20—as well as the gate of MP1—to go negative. This regeneratively increases the drive to MP1 while turning MP2 off, such that the comparator changes state.

The presence of MP5 and MP6 as described herein diminishes the overdrive needed to switch the comparator. Because MP5 and MP6 are FETs like MP1 and MP2, the "spacer" voltage provided by MP5/MP6 is just right to minimize the extra drive required to switch the comparator. The use of MP5 and MP6 in this way also ensures that the spacer voltage tracks variations in MP1 and MP2 due to temperature and lot-to-lot manufacturing differences.

In this way, MP5 and MP6 provide control over the hysteresis of the comparator. If sized the same as MP1 and MP2, hysteresis can be virtually eliminated. Sizing MP5 and MP6 larger or smaller than MP1 and MP2 can create a small hysteresis, or create a small overlap of states, if desired.

When arranged as described above, the present voltage selector circuit is powered by the input voltages it compares. In addition, the comparator's outputs (at nodes 16 and 18) swing up to the largest available input voltage. And, as OUT is always equal to the largest available input voltage, it can be connected to the wells of MOSFETs such as MP3 and MP4—thereby preventing their body diodes from becoming forward-biased.

Figure 2:
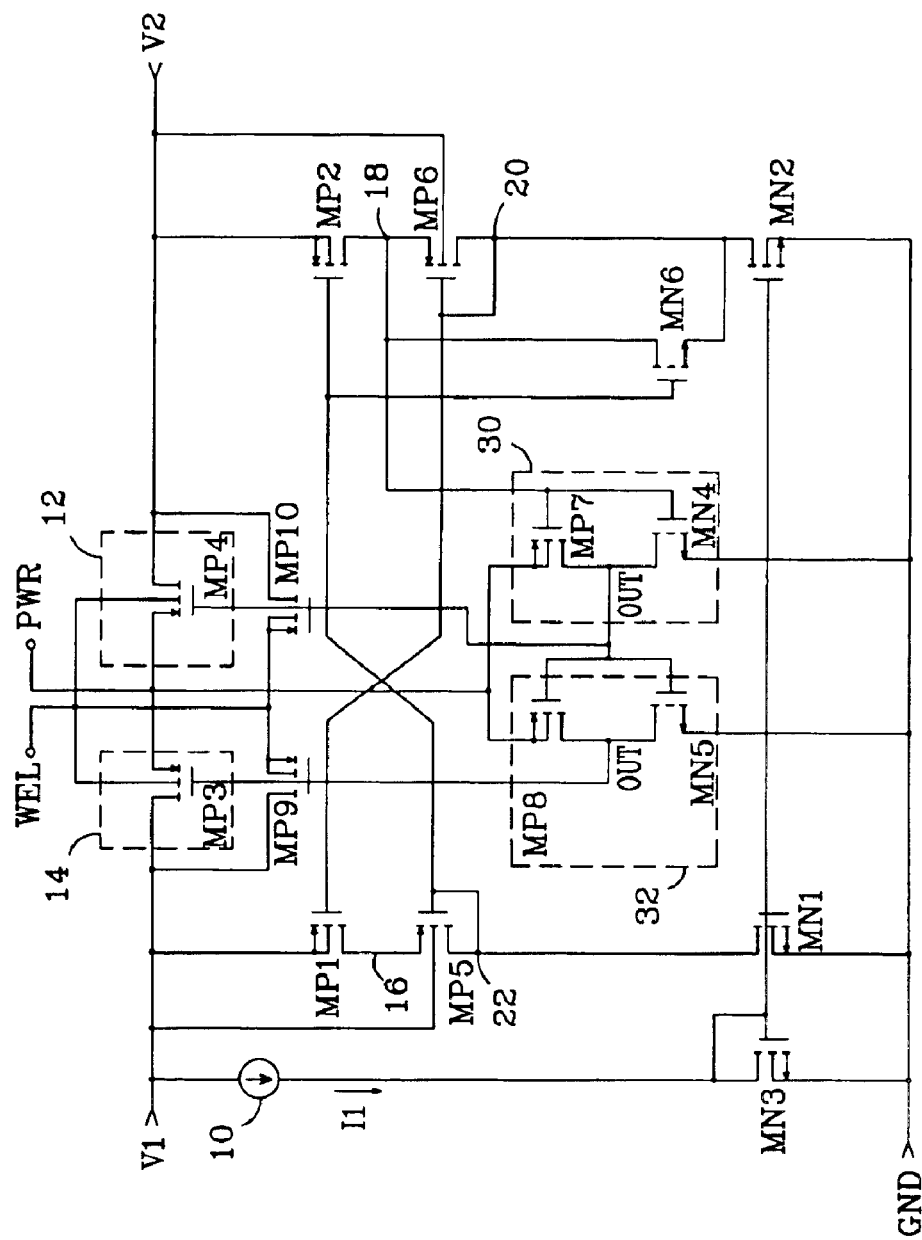
FIG. 2 is a schematic diagram of a preferred embodiment of a voltage selector circuit per the present invention.

A schematic diagram of a preferred embodiment of a voltage selector circuit in accordance with the present invention is shown in FIG. 2. Here, a pair of inverters 30 and 32 are used to operate switches 12 and 14. The input of inverter 30 is suitably connected to comparator output node 18, and its output is connected to switch 12 and the input of inverter 32. The output of inverter 32 is then connected to operate switch 14. Thus, assuming switches 12 and 14 are implemented with PMOS FETs as shown in FIG. 2: when V1>V2, node 18 is low, the output of inverter 30 is high such that switch 12 (MP4) is off, and the output of inverter 32 is low such that switch 14 (MP3) is turned on and V1 is selected as the highest available input voltage. When V2>V1, node 18 is high, the outputs of inverters 30 and 32 are low and high, respectively, such that MP4 is turned on and V2 is selected as the highest available input voltage.

The use of inverters 30 and 32 is preferred as they serve to sharpen the comparator's output transitions as the comparator changes state. The gain from the differential inputs at V1 and V2 is finite; as such, the comparator outputs exhibit rounded corners as V1 and V2 approach the switching point. The inverters ignore this rounding, and only switch after the outputs have begun to regenerate and cross through the mid-signal range, making the drive to the switches change abruptly.

Inverter 30 is preferably implemented with a PMOS FET MP7 and an NMOS FET MN4, with inverter 32 comprising PMOS FET MP8 and NMOS FET MN5. The sources of PMOS FETs MP7 and MP8 are connected to the output of the voltage selector circuit, such that inverters 30 and 32 are powered by the highest available input voltage as selected by the circuit.

As noted above, diode-connected transistors MP5 and MP6 limit the voltage swings at nodes 16 and 18. In order to provide a wider swing more suitable to driving inverter 30, an NMOS FET MN6 is preferably connected between nodes 18 and 20 and has its gate connected to node 22, to enhance the voltage swing of node 18 (and thus the input to inverter 30).

In operation, when V2>V1, node 18 is pulled up to nearly V2, providing the maximum possible positive voltage to the input of inverter 30. When V1>V2, node 20 is pulled low by MN2, nearly to GND potential. As that happens, node 22 is held positive by MP1 and MP5. With node 22 positive, MN6 is turned on and pulls node 18 down to nearly equal the node 20 voltage at its lowest extreme. This makes node 18 swing between the highest available input voltage and GND, so that inverter 30 is easily driven.

Note that inverters 30 and 32 might alternatively be driven by the opposite side of the comparator, from the junction 16 of MP1 and MP5. In this case, the output of inverter 30 would be connected to operate switch 14 and the output of inverter 32 would operate switch 12. An NMOS FET analogous to MN6 could be connected between junction 16 and node 22, and be driven by node 20, to enhance the voltage swing at node 16.

The present voltage selector circuit preferably provides at least two separate outputs. These can be provided, for example, by connecting a pair of PMOS FETs MP9 and MP10 in parallel with MP3 and MP4, respectively. Here, MP3 and MP4 are operated to connect the higher of V1 or V2 to an output labeled "PWR", while MP9 and MP10 connect the higher of V1 or V2 to an output labeled "WEL". MP3 and MP9 are both driven with the output of inverter 32, while MP4 and MP10 are both driven with the output of inverter 30.

This arrangement prevents anomalies on one output from corrupting the other. For example, the voltage selector could be used with a voltage regulator which can be connected to regulate any of several available input voltages. The PWR output could be employed to operate various control circuits for the regulator—thereby ensuring that they are referred to a voltage at least as high as the input voltage selected for regulation. The WEL output could be connected to the wells of any FETs connected to the regulator's output (as well as to the wells of MP3, MP4, MP9 and MP10), to avoid forward-biasing their body diodes. Any glitches that occur on one output—e.g., due to transient currents that must be supplied by the PWR output—do not appear on the WEL output, such that FETs connected to the WEL output avoid problems caused by having their body diodes momentarily forward-biased.

Additional pairs of switches could be added in parallel with MP3/MP4 and MP9/MP10, to provide additional separate outputs if needed.

Figure 3:
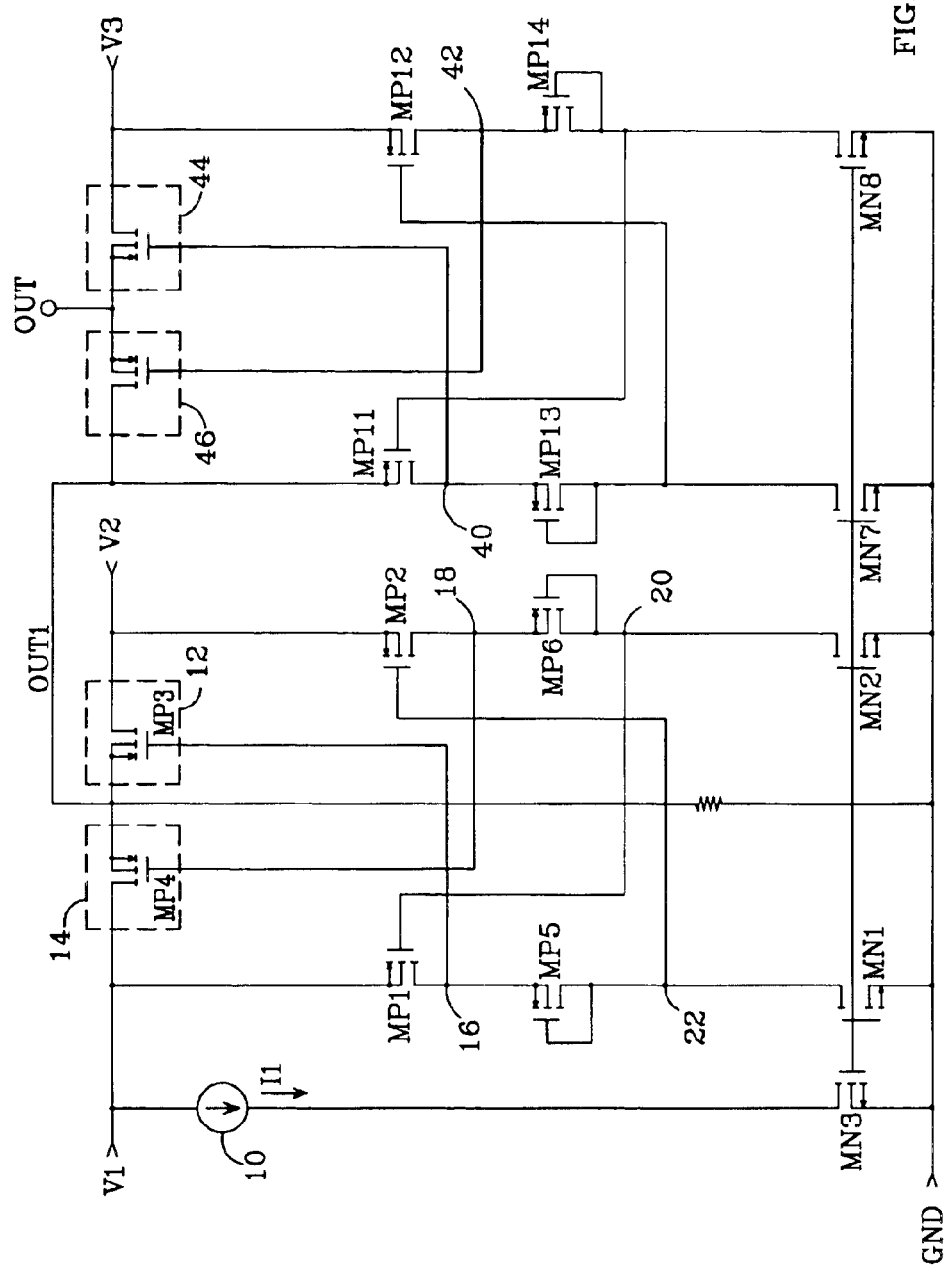
FIG. 3 is a schematic diagram of an embodiment of a voltage selector circuit per the present invention, which is capable of selecting the highest of three available input voltages.

The present invention is easily adapted for use with more than two available input voltages. One illustrative embodiment is shown in FIG. 3, which depicts a voltage selector circuit which selects the higher of three available input voltages: V1, V2 and V3.

Two comparators are used. The circuitry required to select the higher of V1 and V2 is as shown in FIG. 1: FETs MP1, MP2, MP5 and MP6 form a first comparator which determines the higher of V1 and V2 and operates switches 12 and 14 to connect the higher of V1 or V2 to a first output terminal OUT1. A second comparator, configured in the same manner as the first, is used to compare OUT1 to V3. FETs MP11 and MP12, and diode-connected FETs MP13 and MP14, are arranged like MP1, MP2, MP5 and MP6, respectively. A pair of NMOS FETs MN7 and MN8 are connected in a current mirror configuration with MN3 to produce bias currents for the two branches of the second comparator. The outputs of the second comparator, at nodes 40 and 42, operate a pair of switches 44 and 46, respectively.

In operation, the first comparator produces OUT1: when V1>V2, OUT1=V1; when V2>V1, OUT1=V2. The second comparator produces an overall output OUT: when OUT1>V3, OUT=OUT1; when V3>OUT1, OUT=V3. In this way, the higher of V1, V2 and V3 is connected to OUT. This approach can be extended to additional input voltages as needed, with the circuitry which makes up the second comparator repeated for each additional input voltage.

Note that each of the enhancements described in relation to FIG. 2 could also be employed with the comparators shown in FIG. 3. For example, pairs of inverters could be added to the two comparators to drive switches 12, 14, 44 and 46 and sharpen the transitions of the comparator outputs. Similarly, each of the two comparators could employ a FET analogous to MN6 to enhance the voltage swing of the signal driving the inverters. Pairs of switches parallel to 44 and 46 could be added to provide additional overall output signals which are separate from OUT.

Figure 4:
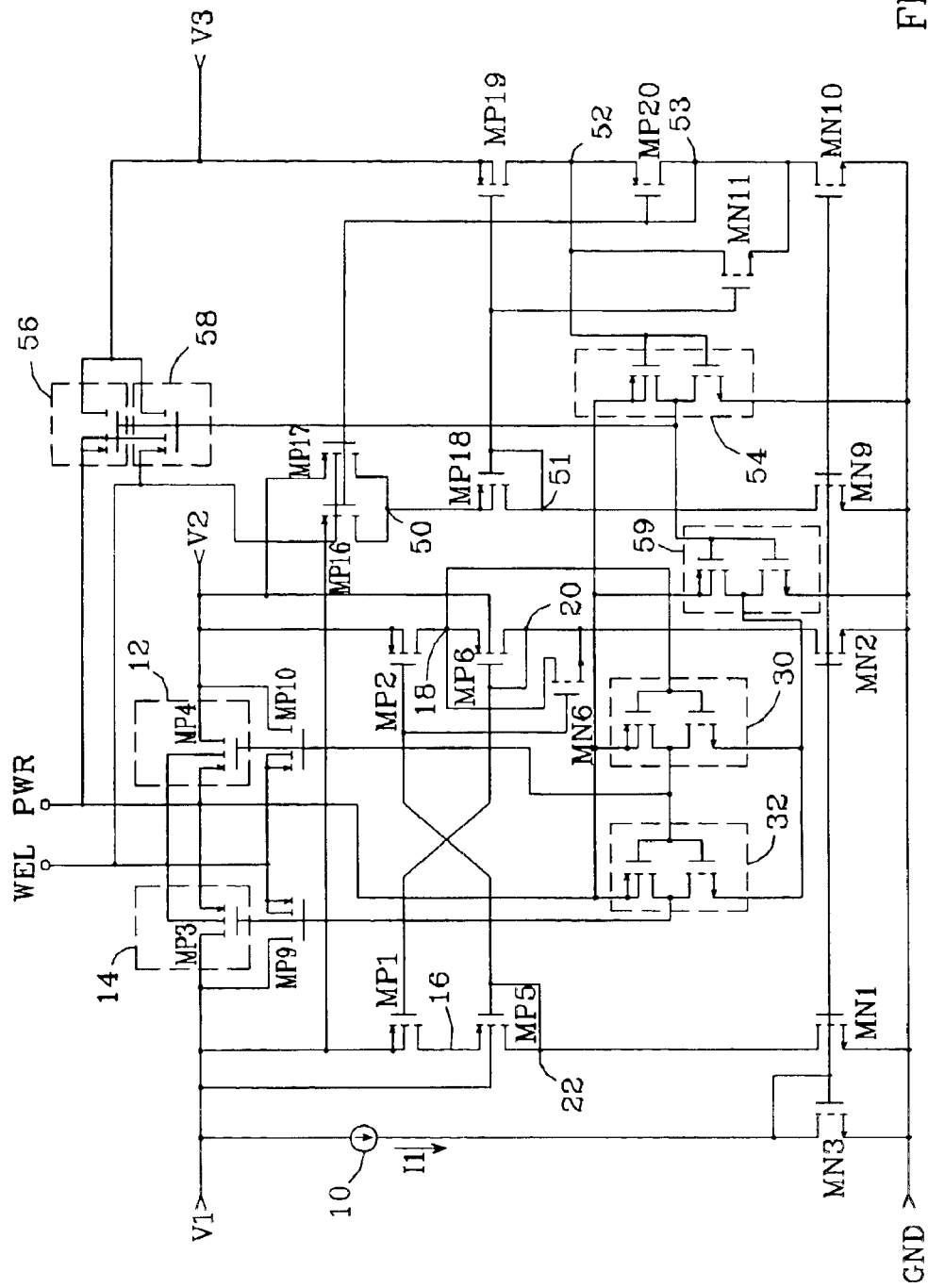
FIG. 4 is a schematic diagram of another embodiment of a voltage selector circuit per the present invention, which is capable of selecting the highest of three available input voltages.

Another possible embodiment of the invention as adapted for use with more than two input voltages is shown in FIG. 4, which is also arranged to select the higher of available three input voltages: V1, V2 and V3. Here, circuitry to select the higher of V1 and V2 is similar to that shown in FIG. 2: FETs MP1, MP2, MP5 and MP6 form a first comparator which determines the higher of V1 and V2. The comparator's output node 18 is connected to operate switches 12 and 14 and FETs MP9 and MP10 via inverters 30 and 32, to connect the higher of V1 or V2 to output terminals PWR and WEL. As in FIG. 2, FIG. 4 includes FET MN6 to enhance the voltage swing of node 18.

Also included are a pair of PMOS FETs MP16 and MP17, having their sources connected to V1 and V2, respectively, and their drains connected together at a node 50. A diode-connected FET MP18 is connected between node 50 and a node 51, which is in turn connected to a FET MN9 connected in a mirror arrangement with MN3 to provide bias current to MP16/MP17 via MP18. A PMOS FET MP19 is connected between input voltage V3 and a node 52, and a diode-connected FET MP20 is connected between node 52 and a node 53, which is in turn connected to a FET MN10 connected in a mirror arrangement with MN3 to provide bias current to MP19 via MP20. The gates of MP16 and MP17 are connected to node 53, and the gate of MP19 is connected to node 51, thereby forming a second comparator with positive feedback similar in configuration to the first comparator.

An inverter 54 is preferably connected to node 52 at its input, and its output is connected to a pair of switches 56 and 58 which are arranged to connect V3 to the PWR and WEL terminals, respectively, when turned on. A FET MN11, analogous to MN6 discussed above, is connected between nodes 52 and 53 and is driven by node 51 to enhance the voltage swing at the input to inverter 54.

In operation, if V2<V3, MP17 can be neglected. V1 is then compared with V3 via MP16 and MP19, respectively, of the second comparator. If V1>V3, the second comparator's output (node 52) goes low and switches 56 and 58 are held off. The first comparator compares V1 and V2 as before, with the higher of V1 and V2 being connected to PWR and WEL via switches MP3, MP4, MP9 and MP10 as applicable.

If V1<V3, MP16 can be neglected. V2 is then compared with V3 via MP17 and MP19, respectively, of the second comparator. If V2>V3, the second comparator's output (node 52) goes low and switches 56 and 58 are held off. The first comparator compares V1 and V2 as before, with the higher of V1 and V2 being connected to PWR and WEL via switches MP3, MP4, MP9 and MP10 as applicable.

If both V1 and V2 are less than V3, the second comparator operates such that node 52 is driven high, and the output of inverter 54 goes low and turns on switches 56 and 58, thereby connecting V3 to PWR and WEL, respectively.

When both V1 and V2 are less than V3, it is necessary to ensure that MP3, MP4, MP9 and MP10 are all kept off, so that neither V1 or V2 is switched to PWR and WEL. This is preferably accomplished with the use of an inverter 59 having its input connected to the output of inverter 54, its output connected to the low sides of inverters 30 and 32 (which are no longer hard-wired to ground), and which uses PWR as its supply voltage. In operation, when both V1 and V2 are less than V3, the output of inverter 54 is low and the output of inverter 59 is high. This connects the low sides of inverters 30 and 32 to PWR (which has been switched to V3 via switch 56), disabling the inverters and turning off MP3, MP4, MP9 and MP10 as required. When V3 is not the highest available voltage, the output of inverter 54 is high and the output of inverter 59 is low; this connects the low sides of inverters 30 and 32 to ground, enabling the higher of V1 or V2 to be connected to PWR and WEL.

If both V1 and V2 are greater than V3, the second comparator's output (node 52) will be low and switches 56 and 58 are held off. The first comparator compares V1 and V2 as before, with the higher of V1 and V2 being connected to PWR and WEL via switches MP3, MP4, MP9 and MP10 as applicable.

In the configuration shown in FIG. 4, the highest available input voltage need traverse only one switch on its way to the load, rather than two—as it might in the FIG. 3 configuration. The FIG. 4 arrangement might be preferred if load current is large, which in FIG. 3 could necessitate the use of larger switches when two are in series.

Figure 5:
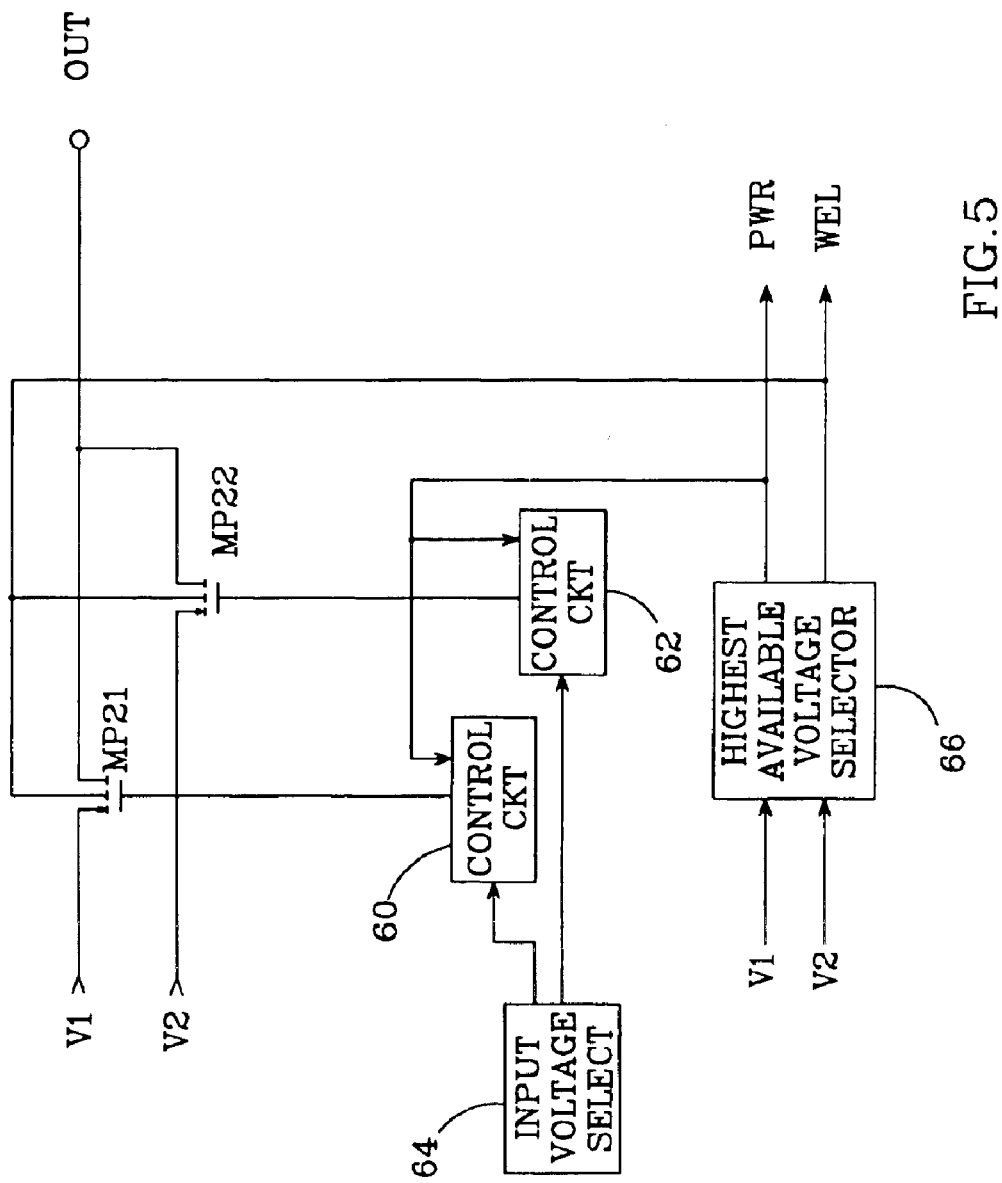
FIG. 5 is a block/schematic diagram of linear voltage regulator which employs a voltage selector circuit per the present invention.

The present voltage selector is suitably employed with a linear voltage regulator having several available input voltages, from which it selects one to be the source of a regulated output voltage. An exemplary embodiment of this application is illustrated in FIG. 5. Here, there are two available input voltages V1 and V2. PMOS pass transistors MP21 and MP22 are connected in series between input voltages V1 and V2, respectively, and the regulator's output terminal OUT. Pass transistors MP21 and MP22 are connected to respective control circuits 60 and 62. An input voltage selection circuit 64 enables one of control circuits 60 or 62 to select input voltage V1 or V2 as the source of the regulated output voltage.

A highest available voltage selector circuit 66 in accordance with the present invention (as shown, for example, in FIG. 2) receives available input voltages V1 and V2, and connects its outputs PWR and WEL to the higher of V1 and V2. To ensure that control circuits 60 and 62 are referred to a voltage at least as high as the input voltage selected for regulation, each is connected such that it is powered by the PWR output of highest available voltage selector circuit 66. To ensure that any FET connected to the regulated output is connected to a voltage at least as high as the input voltage selected for regulation, the wells of FETs MP21 and MP22 are connected to the WEL output of highest available voltage selector circuit 66, to avoid forward biasing their body diodes.

Note that the application shown in FIG. 5 is merely one possible application of the present highest available voltage selector circuit 66. The invention is useful in any application in which there is a need to select from among the highest of several available input voltages.

FIGS. 1–4 depict the bias currents being derived from a current source 10 connected to V1. The invention is not limited to this arrangement. For example, the bias currents might alternatively be derived from a source connected to a voltage other than V1. Or, multiple sources might be used to ensure that the bias currents are non-zero (as would occur if V1 was zero in FIGS. 1–4).

While particular embodiments of the invention have been shown and described, numerous variations and alternate embodiments will occur to those skilled in the art. Accordingly, it is intended that the invention be limited only in terms of the appended claims.

I claim:

1. A highest available voltage selector circuit, comprising:
    a first input voltage V1 and a second input voltage V2,
    first and second current sources which output first and second bias currents, respectively,
    a comparator, comprising:
        first and second field-effect transistors (FETs) having their sources connected to V1 and V2, respectively, and biased with said first and second bias currents,
        a third FET, diode-connected, connected to said first FET at a first node and to the output of said first current source at a second node such that said third FET conducts said first bias current to said first FET, and
        a fourth FET, diode-connected, connected to said second FET at a third node and to the output of said second current source at a fourth node such that said fourth FET conducts said second bias current to said second FET,
        the gates of said first and second FETs connected to said fourth and second nodes, respectively, such that said first FET is driven on regeneratively when V1>V2 and said second FET is driven on regeneratively when V2>V1,
    a first switch which connects V1 to a first output terminal when said first FET is driven on, and
    a second switch which connects V2 to said first output terminal when said second FET is driven on such that said first output terminal is at the highest of V1 and V2.

2. The voltage selector circuit of claim 1, wherein said first and second current sources are powered by at least one of V1 and V2 such that said highest available voltage selector circuit is entirely powered by the voltages it compares.

3. The voltage selector circuit of claim 1, wherein said first and second bias currents are equal.

4. The voltage selector circuit of claim 1, wherein said first and second switches are MOSFETs, the wells of which are connected to said first output terminal such that said wells are biased with the highest of V1 and V2.

5. The voltage selector circuit of claim 1, further comprising:
    a third switch which connects V1 to a second output terminal when said first FET is driven on, and
    a fourth switch which connects V2 to said second output terminal when said second FET is driven on.

6. The voltage selector circuit of claim 5, wherein said first, second, third and fourth switches are MOSFETs, the wells of which are connected to one of said first and second output terminals such that said wells axe biased with the highest of V1 and V2.

7. The voltage selector circuit of claim 1, wherein said circuit is referenced to a ground potential, further comprising a fifth FET having its drain-source circuit connected between said third node and said fourth node and its gate connected to said second node such that said fifth FET pulls said third node toward said ground potential when said first FET is driven on.

8. The voltage selector circuit of claim 1, further comprising:
    a first inverter connected to said third node at its input,
    a second inverter connected to said first inverter's output at its input,
    the output of said first inverter connected to operate said second switch and the output of said second inverter connected to operate said first switch such that said first switch connects V1 to said first output terminal when said first FET is driven on and said second switch connects V2 to said first output terminal when said second FET is driven on such that said first output terminal is at the highest of V1 and V2.

9. The voltage selector circuit of claim 1, further comprising:
    a third input voltage V3,
    third and fourth current sources which output third and fourth bias currents, respectively,
    a second comparator, comprising:
        fifth and sixth FETs having their sources connected to said first output terminal and V3, respectively, and biased with said third and fourth bias currents,
        a seventh FET, diode-connected, connected to said fifth FET at a fifth node and to the output of said third current source at a sixth node such that said seventh FET conducts said third bias current to said fifth FET, and
        an eighth FET, diode-connected, connected to said sixth FET at a seventh node and to the output of said fourth current source at an eighth node such that said eighth FET conducts said fourth bias current to said sixth FET,
        the gates of said fifth and sixth FETs connected to said eighth and sixth nodes, respectively, such that said fifth FET is driven on regeneratively when the voltage at said output terminal is greater than V3 and said sixth FET is driven on regeneratively when V3 is greater than the voltage at said output terminal,
    a third switch which connects said first output terminal to a second output terminal when said fifth FET in driven on, and
    a fourth switch which connects V3 to said second output terminal when said sixth FET is driven on such that said second output terminal is at the highest of V1, V2 and V3.

10. The voltage selector circuit of claim 1, further comprising:
   a third input voltage V3,
   third and fourth current sources which output third and fourth bias currents, respectively,
   fifth and sixth FETs having their sources connected to V1 and V2, respectively, their drains connected together at a fifth node, and biased with said third bias current,
   a seventh FET, diode-connected, connected to said fifth node and to the output of said third current source at a sixth node such that said seventh FET conducts said third bias current to said fifth and sixth FETs,
   an eighth FET having its source connected to V3,
   a ninth FET, diode-connected, connected to the drain of said eighth FET at a seventh node and to said fourth current source at an eighth node such that said ninth FET conducts said fourth bias current to said eighth FET,
   the gates of said fifth and sixth FETs connected to said eighth node and the gate of said eighth FET connected to said sixth node such that one of said fifth or sixth FETs is driven on regeneratively when V1 or V2>V3 and said eighth FET is driven on regeneratively when V3>V1 and V2, and
   a third switch coupled to said seventh node and arranged to connect V3 to said output terminal when said eighth FET is driver on.

11. The voltage selector circuit of claim 10, further comprising a first inverter connected to said seventh node at its input and to said third switch at its output such that said third switch connects V3 to said first output terminal when said eighth FET is driven on.

12. The voltage selector circuit of claim 11, further comprising:
   a second inverter having a supply terminal connected to said first output terminal, a ground terminal, and an input which is connected to said third node,
   a third inverter having a supply terminal connected to said first output terminal, a ground terminal, and an input which is connected to said second inverter's output, and
   a fourth inverter having a supply terminal connected to said first output terminal, an input which is connected to the output of said first inverters and an output which is connected to the ground terminals of said second and third inverters such that said second and third inverters are disabled when V3>V1 and V2,
   the output of said second inverter connected to operate said second switch and the output of said third inverter connected to operate said first switch such that said first switch connects V1 to said first output terminal when V1>V2 or V3 and said second switch connects V2 to said first output terminal when V2>V1 or V3 such that said first output terminal is at the highest of V1, V2 and V3.

13. A highest available voltage selector circuit, comprising:
   a first input voltage V1 and a second input voltage V2,
   first and second current sources which are powered by at least one of said first and second input voltages and which output equal first and second bias currents, respectively,
   a comparator, comprising:
      first and second field-effect transistors (FETs) having their sources connected to V1 and V2, respectively, and biased with said first and second bias currents,
      a third FET, diode-connected, connected to said first FET at a first node and to the output of said first current source at a second node such that said third FET conducts said first bias current to said first FET, and
      a fourth FET, diode-connected, connected to said second FET at a third node and to the output of said second current source at a fourth node such that said fourth FET conducts said second bias current to said second FET,
      the gates of said first and second FETs connected to said fourth and second nodes, respectively, such that said first FET is driven on regeneratively when V1>V2 and said second FET is driven on regeneratively when V2>V1,
   a first inverter, the input of which is connected to one of said first and third nodes,
   a second inverter, the input of which is connected to the output of said first inverter,
   a first switch which is operated in response to the output of one of said first and second inverters to connect V1 to a first output terminal when said first FET is driven on,
   a second switch which is operated in response to the output of the other of said first and second inverters to connect V2 to said first output terminal when said second FET is driven on such that said first output terminal is at the highest of V1 and V2,
   a third switch which is operated in response to the output of one of said first and second inverters to connect V1 to a second output terminal when said first FET is driven on, and
   a fourth switch which is operated in response to the output of the other of said first and second inverters to connect V2 to said second output terminal when said second FET is driven on such that said second output terminal is at the highest of V1 and V2.

14. The voltage selector circuit of claim 13, wherein said first, second, third and fourth switches are MOSFETs, the wells of which are connected to one of said first and second output terminals such that said wells are biased with the highest of V1 and V2.

15. The voltage selector circuit of claim 13, wherein said circuit is referenced to a ground potential, further comprising a fifth FET having its drain-source circuit connected between said third node and said fourth node and its gate connected to said second node such that said fifth FET pulls said third node toward said ground potential when said first FET is driven on.

16. A linear voltage regulator, comprising:
   at least two available input voltages,
   a plurality of pass transistors, each of which is connected in series between a respective one of said available input voltages and a common output terminal,
   a plurality of control circuits, each of which is arranged to, when enabled, control a respective one of said pass transistors to provide a desired output voltage at said common output terminal,
   a highest available voltage selector circuit, comprising:
      first and second current sources which output first and second bias currents, respectively,
      a comparator, comprising:
         a first field-effect transistor (FET) having its source connected to one (V1) of said at least two available input voltages, and biased with said first bias current, a second FET having its source connected to another (V2) of said at least two available input voltages, and biased with said second bias current, a third FET, diode-connected, connected to said first FET at a first node and to the output of said first current source at a second node such that said third FET conducts said first bias current to said first FET, and a fourth FET, diode-connected, connected to said second FET at a third node and to the output of said second current source at a fourth node such that said fourth FET conducts said second bias current to said second FET, the gates of said first and second FETs connected to said fourth and second nodes, respectively, such that said first FET is driven on regeneratively when V1>V2 and said second FET in driven on regeneratively when V2>V1, a first switch which connects V1 to an output node when said first FET is driven on, and a second switch which connects V2 to said output node when said second FIST is driven on such that said output node is at the highest of V1 and V2, said control circuits connected to said output node such that they are powered by the higher of V1 and V2.

17. The voltage regulator of claim 16, wherein said pass transistors are MOSFETs, the wells of which are connected to said output node such that said wells are biased with the higher of V1 and V2.

18. The voltage regulator of claim 17, further comprising:

a third switch which connects V1 to a second output node when said first FET is driven on, and a fourth switch which connects V2 to said second output node when said second FET is driven on, said control circuits connected to said first output node and said pass transistor wells connected to said second output node such that said control circuits are powered and said pass transistor wells are biased with the higher of V1 and V2.

\* \* \* \* \*

UNITED STATES PATENT AND TRADEMARK OFFICE
CERTIFICATE OF CORRECTION

PATENT NO. : 6,847,249 B1
DATED : January 25, 2005
INVENTOR(S) : A. Paul Brokaw

It is certified that error appears in the above-identified patent and that said Letters Patent is hereby corrected as shown below:

Column 3,
Line 9, "MPG" should be -- MP6 --

Column 9,
Line 45, "inverters" should be -- inverter --

Column 11,
Line 17, "in" should be -- is --

Column 12,
Line 2, "FIST" should be -- FET --

Signed and Sealed this

Twelfth Day of April, 2005

JON W. DUDAS
*Director of the United States Patent and Trademark Office*